(12) United States Patent
Huffman et al.

(10) Patent No.: US 12,172,888 B2
(45) Date of Patent: Dec. 24, 2024

(54) ANTI-STICTION ENHANCEMENT OF RUTHENIUM CONTACT

(71) Applicant: Qorvo US, Inc., Greensboro, NC (US)

(72) Inventors: James D. Huffman, Richardson, TX (US); Mickael Renault, San Jose, CA (US); Shibajyoti Ghosh Dastider, San Jose, CA (US); Lance Barron, Richardson, TX (US); Willibrordus G. M. Van Den Hoek, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 310 days.

(21) Appl. No.: 17/632,762

(22) PCT Filed: Aug. 6, 2020

(86) PCT No.: PCT/US2020/045169
§ 371 (c)(1),
(2) Date: Feb. 3, 2022

(87) PCT Pub. No.: WO2021/026333
PCT Pub. Date: Feb. 11, 2021

(65) Prior Publication Data
US 2022/0289566 A1 Sep. 15, 2022

Related U.S. Application Data

(60) Provisional application No. 62/884,114, filed on Aug. 7, 2019.

(51) Int. Cl.
*B81C 1/00* (2006.01)
*B81B 3/00* (2006.01)

(52) U.S. Cl.
CPC ........ *B81C 1/00968* (2013.01); *B81B 3/0005* (2013.01); *B81B 2203/0109* (2013.01);
(Continued)

(58) Field of Classification Search
CPC ........ B81C 1/00968; B81C 2201/0105; B81C 2201/112; B81B 3/0005;
(Continued)

(56) References Cited

U.S. PATENT DOCUMENTS

| 4,576,918 A | 3/1986 | Yeung |
| 4,948,458 A | 8/1990 | Ogle |

(Continued)

FOREIGN PATENT DOCUMENTS

| DE | 19752218 A1 | 7/1998 | |
| WO | WO-2008064216 | * 5/2008 | |
| WO | WO-2018063814 A1 | * 4/2018 | ........... H01H 1/0036 |

OTHER PUBLICATIONS

Haruyama, Y., "Study of the fluorinated self-assembled monolayer by photoemission and NEXAFS spectroscopies," SPring-8/SACLA Research Frontiers 2016, Aug. 2017, Japan Synchrotron Radiation Research Institute (JASRI), pp. 127-128.

(Continued)

*Primary Examiner* — Yasser A Abdelaziz
(74) *Attorney, Agent, or Firm* — Withrow & Terranova, P.L.L.C.

(57) ABSTRACT

A method of manufacturing a MEMS device. The MEMS device has a cavity in which a beam will move to change the capacitance of the device. After most of the device build-up has occurred, sacrificial material is removed to free the beam within the MEMS device cavity. Thereafter, exposed ruthenium contacts are exposed to fluorine to either: dope exposed ruthenium and reduce surface adhesive forces, form fluorinated Self-Assembled Monolayers on the exposed ruthenium surfaces, deposit a nanometer passivating film on exposed ruthenium, or alter surface roughness of the ruthe- (Continued)

nium. Due to the fluorine treatment, low resistance, durable contacts are present, and the contacts are less susceptible to stiction events.

15 Claims, 4 Drawing Sheets

(52) U.S. Cl.
CPC ............... *B81B 2203/0307* (2013.01); *B81B 2203/0315* (2013.01); *B81B 2203/04* (2013.01); *B81C 2201/0105* (2013.01); *B81C 2201/112* (2013.01)

(58) Field of Classification Search
CPC .... B81B 2203/0109; B81B 2203/0307; B81B 2203/04; B81B 2203/0315; H01H 59/0009
See application file for complete search history.

(56) References Cited

U.S. PATENT DOCUMENTS

| | | |
|---|---|---|
| 5,710,486 A | 1/1998 | Ye et al. |
| 7,923,790 B1 | 4/2011 | Quevy et al. |
| 2002/0088112 A1* | 7/2002 | Morrison, Jr. ....... H01H 1/0036 29/846 |
| 2012/0175715 A1* | 7/2012 | Hammond ........... H01H 1/0036 438/51 |
| 2018/0230001 A1 | 8/2018 | Chang et al. |
| 2020/0021265 A1* | 1/2020 | Lee ...................... H03H 9/173 |

OTHER PUBLICATIONS

International Search Report and Written Opinion for International Patent Application No. PCT/US2020/045169, mailed Nov. 23, 2020, 13 pages.

* cited by examiner

# ANTI-STICTION ENHANCEMENT OF RUTHENIUM CONTACT

This application is a 35 USC 371 national phase filing of International Application No. PCT/US2020/045169, filed Aug. 6, 2020, which in turn claims priority to U.S. Provisional Patent Application No. 62/884,114, filed Aug. 7, 2019, the disclosures of which are incorporated herein by reference in their entireties.

FIELD OF THE DISCLOSURE

Embodiments of the present disclosure generally relate to a method for enhancing anti-stiction properties of a ruthenium contact in a micro-electromechanical system (MEMS) device.

BACKGROUND

Contact sticking, or stiction, is one of the dominant failure mechanisms in MEMS devices. Stiction is one of the key challenges in fabricating viable MEMS devices. Ruthenium contacts provide low resistance, durable contacts, but ruthenium contacts are susceptible to potential stiction events over operating life.

Therefore, there is a need to have low resistance, durable contacts that are less susceptible to stiction events.

SUMMARY

The present disclosure generally relates to a method of manufacturing a MEMS device. The MEMS device has a cavity in which a beam will move to change the capacitance of the device. After most of the device build-up has occurred, sacrificial material is removed to free the beam within the MEMS device cavity. Thereafter, exposed ruthenium contacts are exposed to fluorine to either: dope exposed ruthenium and reduce surface adhesive forces, form fluorinated Self-Assembled Monolayers on the exposed ruthenium surfaces, deposit a nanometer passivating film on exposed ruthenium, or alter surface roughness of the ruthenium. Due to the fluorine treatment, low resistance, durable contacts are present, and the contacts are less susceptible to stiction events.

In one embodiment, a method of manufacturing a MEMS device comprises: forming a beam structure within a cavity, wherein the cavity contains sacrificial material; removing the sacrificial material from the cavity to free the beam to move within the cavity; introducing fluorine into the cavity; and sealing the cavity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
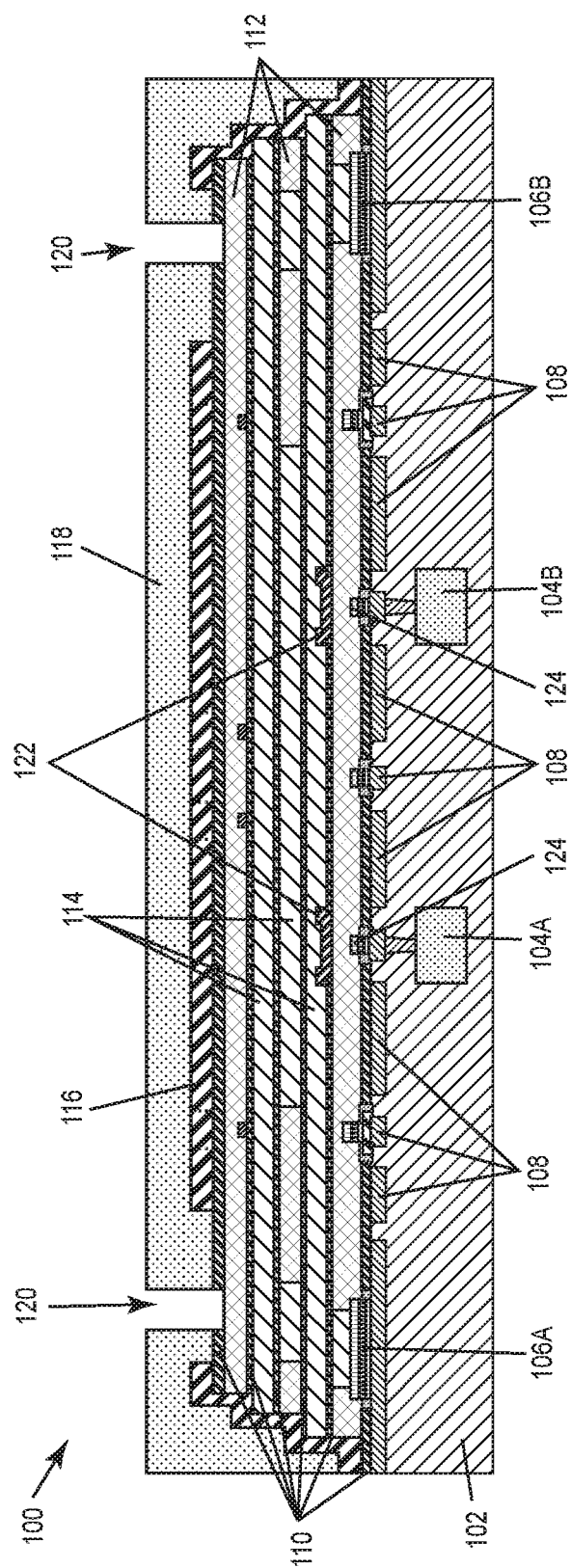
FIG. 1 is a schematic illustration of a MEMS device prior to removing sacrificial material and releasing the beam.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure generally relates to a method of manufacturing a MEMS device. The MEMS device has a cavity in which a beam will move during operation. After most of the device build-up has occurred, sacrificial material is removed to free the beam within the MEMS device cavity. Thereafter, exposed ruthenium contacts are exposed to fluorine to either: dope exposed ruthenium and reduce surface adhesive forces, form fluorinated Self-Assembled Monolayers on the exposed ruthenium surfaces, deposit a nanometer passivating film on exposed ruthenium, or alter surface roughness of the ruthenium. Due to the fluorine treatment, low resistance, durable contacts are present, and the contacts are less susceptible to stiction events.

FIG. 1 is a schematic illustration of a MEMS device 100 prior to removing sacrificial material and releasing the beam. The MEMS device includes a substrate 102, such as a CMOS substrate that includes numerous layers for a semiconductor device. It is also contemplated that the substrate 102 may simply be a semiconductor substrate containing silicon, germanium, or other suitable semiconductor material. In some embodiments, the substrate 102 may comprise glass, quartz, fused silica, sapphire, titanium, titanium tungsten, cobalt, metal silicides, among others. Any suitable material may be used for the substrate 102, and as such, the material of the substrate 102 is not intended to be limiting.

Within the substrate, one or more RF electrodes 104A, 104B are present. It is to be understood that while two RF electrodes 104A, 104B are shown, a single RF electrode, or even more than two RF electrodes is contemplated. The RF electrodes 104A, 104B may comprise any conductive material suitable for use in a semiconductor device such as ruthenium, copper, aluminum, titanium nitride, tungsten, titanium aluminum, titanium aluminum nitrides, and combinations thereof. Any suitable materials may be used for the RF electrodes 104A, 104B, and as such, the materials of the RF electrodes 104A, 104B are not intended to be limiting.

Additional conductive material may be present on or above the substrate 102 as well as the RF electrodes 104A, 104B. For example, anchor electrodes 106A, 106B are shown in FIG. 1 as are numerous additional electrical contacts 108. The anchor electrodes 106A, 106B are the electrodes for the beam structure 114, and the electrical contacts 108 may be used for pull-in electrodes. The anchor electrodes 106A, 106B and the electrical contacts 108 may comprise any conductive material suitable for use in a semiconductor device such as copper, aluminum, titanium nitride, tungsten, and combinations thereof.

A dielectric layer 110 is present over the substrate 102 as well as the electric contacts 108. It is contemplated that the dielectric layer 110 comprises an electrically insulating material such as silicon oxide, silicon dioxide, silicon nitride, silicon oxynitride, or combinations thereof.

A first sacrificial layer 112 is present over the dielectric layer 110. The first sacrificial layer 112 will ultimately be removed to free the beam structure 114. The first sacrificial layer 112 comprises a different material than the dielectric layer 110. Suitable material for the first sacrificial layer 112 includes spin-on material such as a carbon based material. The first sacrificial layer 112 may comprise carbon, hydrogen, nitrogen, and oxygen.

A second dielectric layer 110 is present over the first sacrificial layer 112, and the bottom portion of the beam structure 114 is present over the second dielectric layer 110. The second dielectric layer 110 may comprise the same material as the first dielectric layer 110. The beam structure 114 may comprise any conductive material suitable for use in a semiconductor device such as copper, aluminum, titanium nitride, tungsten TiAlN, and combinations thereof. The beam structure 114 additionally includes a top portion as well as post portions. Dielectric layers 110 are present on the top and bottom surfaces of the beam portions. Additionally, in the areas where the beam structure 114 is not located, additional sacrificial material 112 is present. The sacrificial material 112 may comprise the same material in all locations within the MEMS device 100. In fact, sacrificial material 112 is present over the top portion of the beam structure 114. On and in contact with the topmost sacrificial material 112, an additional dielectric layer 110 is present. A pull-up electrode 116 is present over and on the additional dielectric layer 110. A dielectric roof 118 is also present over the pull-in electrode 116. Release holes 120 are present as well. The release holes 120 extend through the roof 118 to expose the sacrificial material 112.

The bottom of the beam structure 114 has a beam contact portion 122 that comprises ruthenium. An electrical contact stack containing contact surface 124 of ruthenium is present over each RF electrode 104A, 104B. The ruthenium contact surface 124 is the landing location for the beam structure 114 as will be discussed later. The beam contact portion 122 contacts contact surface 124 when the beam structure 114 has been freed and is in the pulled-down state, which is the maximum capacitance state.

Figure 2:
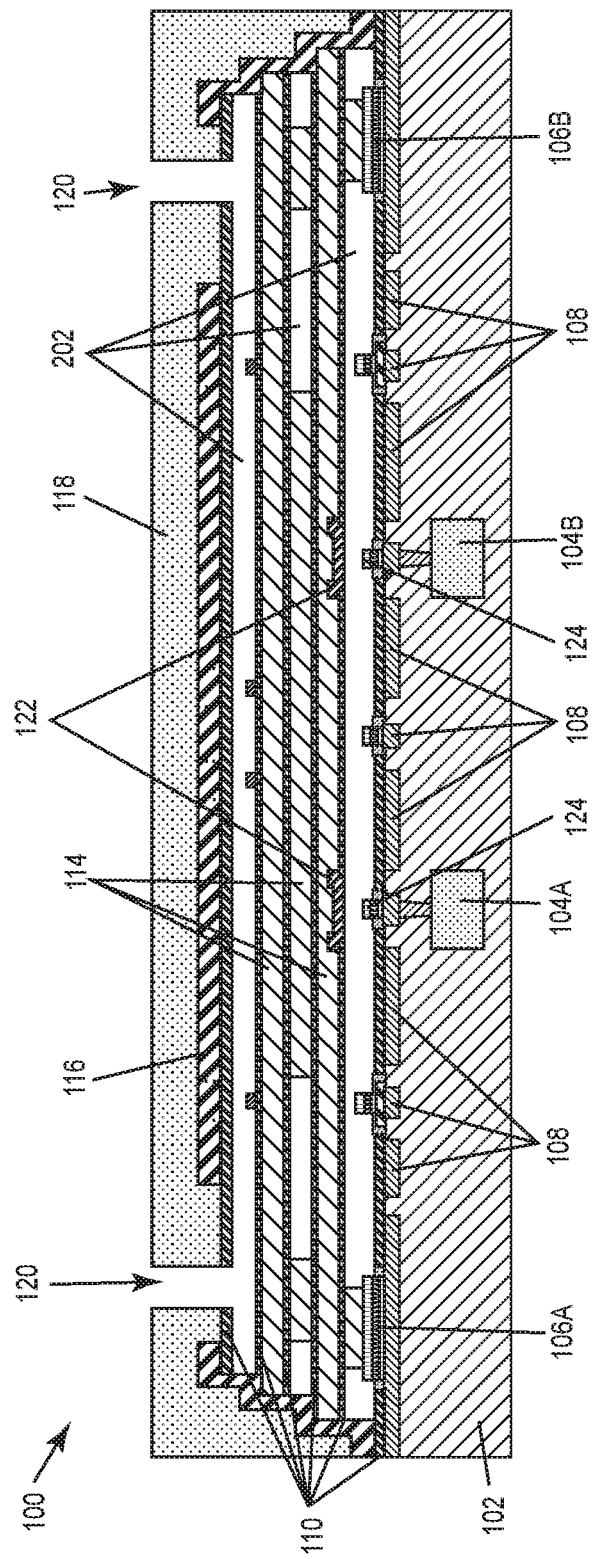
FIG. 2 is a schematic illustration of the MEMS device of FIG. 1 after the sacrificial material has been removed and the beam has been released.

In order to free the beam structure 114 to move in the device 100, the sacrificial material needs to be removed. FIG. 2 is a schematic illustration of the MEMS device 100 of FIG. 1 after the sacrificial material has been removed and the beam has been released. The sacrificial material 112 is removed by an etching process where the etchant, which may be a wet etchant or a dry etchant, is introduced through the release holes 120. Once the sacrificial material 112 is removed, the location where the sacrificial material used to be is considered to be a cavity 202. The beam structure 114 is free to move within the cavity 202.

As noted above, the sacrificial material 112 is removed, but everything else in the device 100 remains. Thus, the contact surface 124 is now exposed as is the contact portion 122. Both the contact surface 124 and the contact portion 122 contain ruthenium. As additionally noted above, ruthenium has low resistance and is a durable contact, but ruthenium contacts are susceptible to potential stiction events over operating life. Hence, it has been surprisingly found that additional treatment of the ruthenium will lead to less stiction.

Fluorine or a fluorine containing compound is introduced to the cavity 202 through the release holes 120 to treat the exposed ruthenium surfaces. In some implementations, the fluorine may be introduced into the cavity 202 prior to depositing the first sacrificial layer 112 to treat the exposed ruthenium surfaces. Fluorine or a fluorine containing compound may be introduced into the cavity 202 using a plasma comprising fluorine. In one embodiment, the plasma is formed from $CF_4$ and/or $O_2$. In another embodiment, gaseous HF or $F_2$ is introduced into the cavity 202. In yet another embodiment, the fluorine introduced into the cavity 202 forms fluorinated Self-Assembled Monolayers (F-SAMs) on the exposed ruthenium surfaces. The F-SAMs may comprise any suitable head group at the substrate level, any suitable tail as the molecular chain, and any suitable functional group as the ending. In yet another embodiment, $TiF_4$ or $MoF_6$ may be introduced into the cavity.

It is further contemplated that other fluorine based gases may be used such as $NF_3$. Thus, the disclosure is not to be limited to $CF_4$. It has surprisingly been found that an insufficient amount of fluorine will not provide enough surface modification to the ruthenium to provide reliable operation over the device lifetime. Additionally, an excessive amount of $C_xF_y$ polymer formation will increase contact resistance to an unacceptable level. Excessive fluorine doping of ruthenium will increase contact resistance to an unacceptable level. Thus, as little polymer formation as possible is desired to maintain low contact resistance while providing enough fluorine exposure to obtain an adequate stiction margin is desired.

When fluorine containing plasmas are utilized, the plasma may be generated by a plasma reactor including a vacuum chamber, one or more gas sources for introducing the reactant gases into the chamber, and one or more RF electrode or antenna capable of generating a plasma in the vacuum chamber. The plasma may be generated in the reactor at a pressure of about 10 mT to about 2000 mT and at a power of about 100 W to about 2000 W. Two main types of sources may be used: capacitively coupled plasmas (CCPs) or inductively coupled plasmas (ICPs). Suitable sources that may be utilized include the plasma reactors of the following US patents: U.S. Pat. Nos. 4,948,458; 4,576,918; and 5,710,486.

Figure 3:
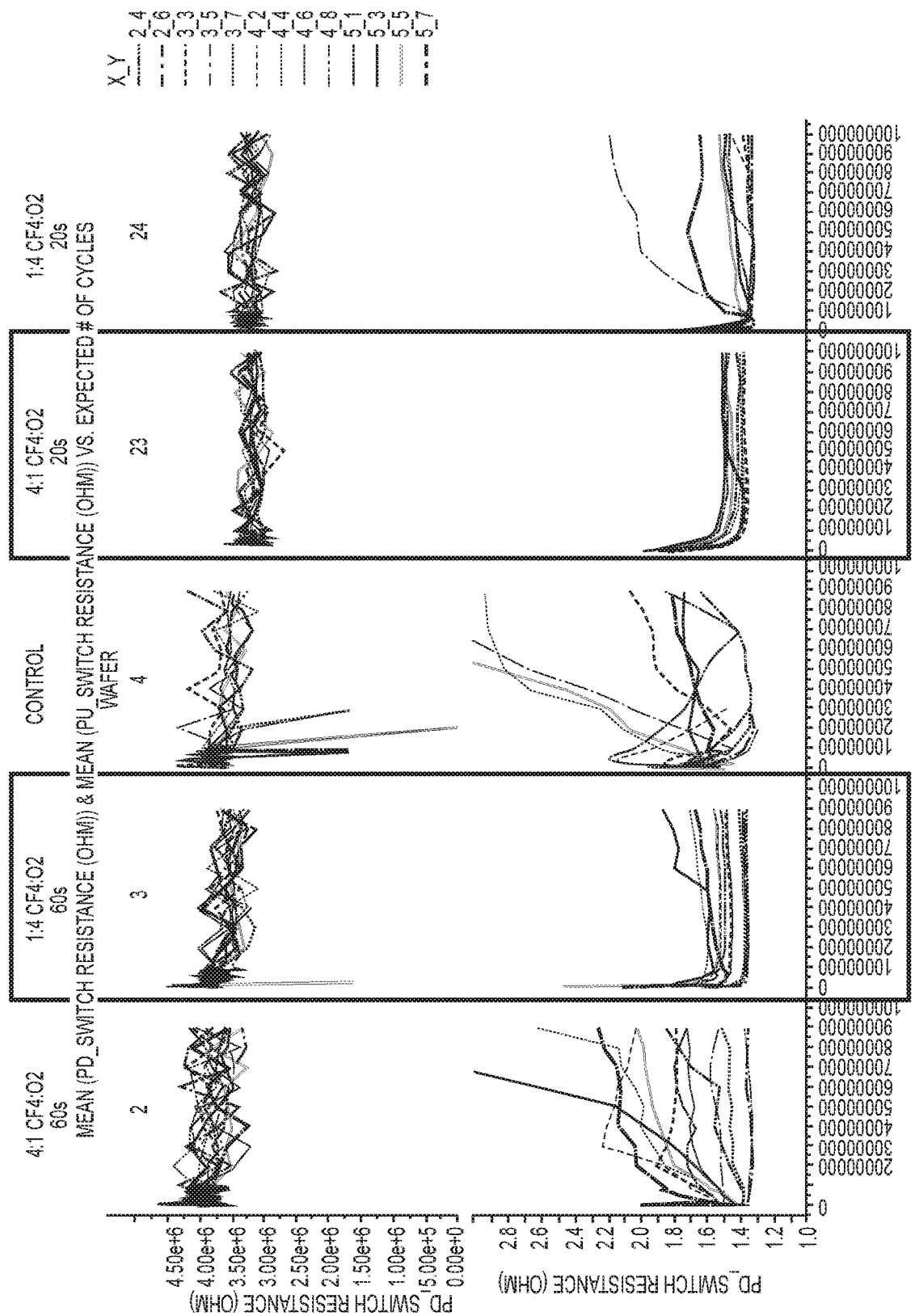
FIG. 3 is a graph showing the resistance versus the number of cycles for various parameters.

FIG. 3 is a graph showing the resistance versus the number of cycles for various parameters when fluorine containing plasmas are utilized, according to one embodiment. The results of FIG. 3 may be obtained utilizing an ICP reactor at a pressure of about 10 mT to about 50 mT and at a power of about 500 W to about 2000 W. As shown in FIG. 3, there is a sweet spot for the fluorine content as well as for the exposure time. For example, it has been found that the plasma exposure should be for a time period of between about 20 seconds to about 60 seconds. Additionally, it has been found that the ratio of $CF_4$ to $O_2$ should be between about 1:4 to about 4:1. When the plasma exposure occurred outside of the time period and ratio, the device resistance was not acceptable a shown in FIG. 3. More specifically operating at a ratio of 1:4 for a time period of 60 seconds produced acceptable results. Additionally, operating at a ratio of 4:1 for a time period of 20 seconds produced acceptable results.

However, operating at a ratio of 4:1 for a time period of 60 seconds did not produce acceptable results. Similarly, operating at a ratio of 1:4 for a time period of 20 seconds did not produce acceptable results. It is contemplated that other ratios and times are possible as well. For example, a ratio of 1:6 for a period of about 100 seconds is also contemplated. The results and data displayed in the graph of FIG. 3 are dependent upon the plasma reactor used as well as the plasma conditions used, such as plasma power, process pressure, exciting frequency, etc. As such, the results and data displayed in the graph of FIG. 3 is not intended to be limiting, but merely shows some examples found to work.

Figure 4:
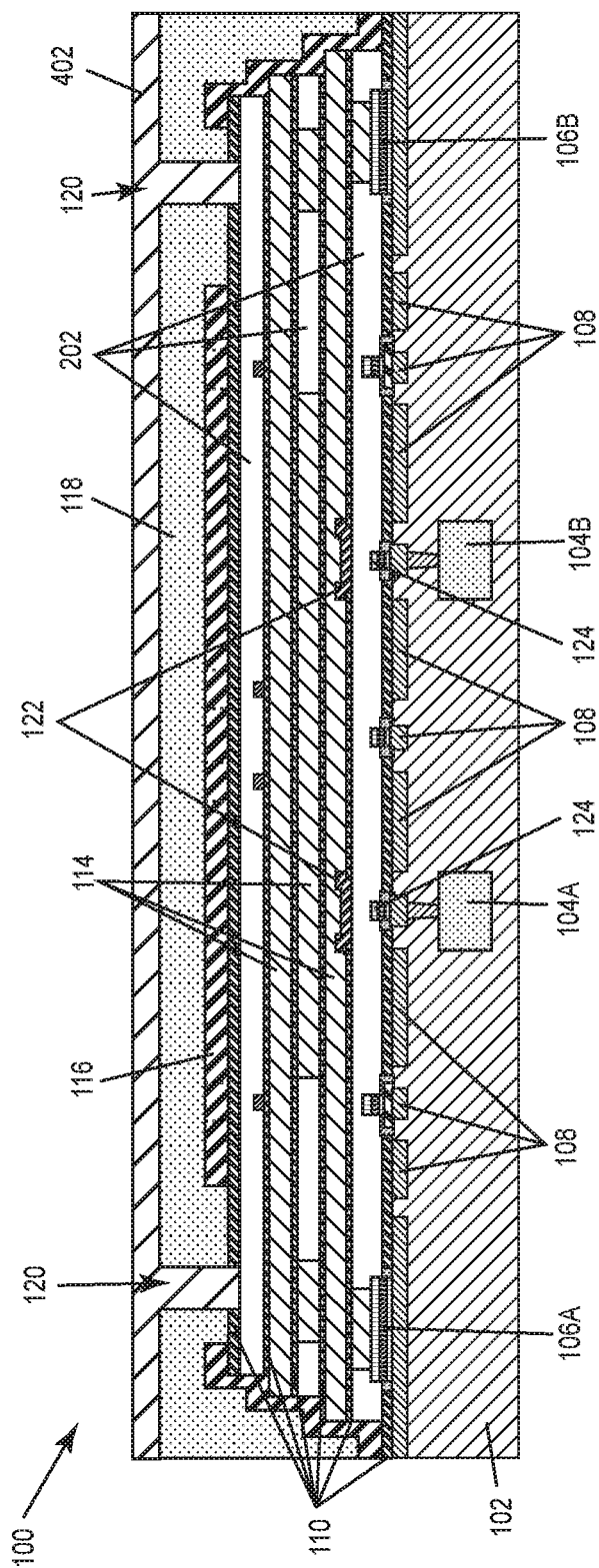
FIG. 4 is a schematic illustration of the MEMS device of FIG. 2 after the MEMS device has been sealed.

Once the sacrificial material 112 has been removed and the exposed ruthenium has been treated, the device 100 is ready to be sealed. FIG. 4 is a schematic illustration of the MEMS device 100 of FIG. 2 after the MEMS device has been sealed. As shown in FIG. 4, a seal 402 is formed to seal the release holes 120. The seal 402 may comprise a dielectric material such as silicon oxide, silicon dioxide, silicon nitride, silicon oxynitride, or combinations thereof.

By treating the exposed ruthenium surfaces after the sacrificial material has been removed, the resulting MEMS device will have contact surfaces that have low resistance, are durable, and are less susceptible to stiction events.

In one embodiment, a method of manufacturing a MEMS device comprises: forming a beam structure within a cavity, wherein the cavity contains sacrificial material; removing the sacrificial material from the cavity to free the beam to move within the cavity; introducing fluorine into the cavity; and sealing the cavity. The fluorine may be introduced using a plasma containing fluorine. The plasma may be formed from a gas containing oxygen and a gas containing fluorine. The gas containing oxygen may be $O_2$. The gas containing fluorine may be $CF_4$. The plasma may be present in the cavity for a period of between about 20 seconds and about 60 seconds. A ratio of $CF_4$ to $O_2$ may be between about 1:4 to about 4:1. The ratio is about 1:4 and the plasma may be present for a period of about 60 seconds. The ratio may be about 4:1 and the plasma may be present for a period of about 20 seconds. The beam structure may include at least one contact portion comprising ruthenium. The fluorine introduced into the cavity may form fluorinated Self-Assembled Monolayers on one or more exposed surfaces within the cavity.

The MEMS device includes an RF electrode that has a contact surface comprising ruthenium. The ruthenium surface of the beam structure is capable of contacting the ruthenium contact surface of the RF electrode. The contact surface comprising ruthenium includes $C_xF_y$ polymers or fluorinated Self-Assembled Monolayers on a surface. The contact surface comprising ruthenium comprises fluorine. The fluorine is introduced for a period of between about 20 seconds and about 60 seconds.

Those skilled in the art will recognize improvements and modifications to the preferred embodiments of the present disclosure. All such improvements and modifications are considered within the scope of the concepts disclosed herein and the claims that follow.

What is claimed is:

1. A method of manufacturing a MEMS device, comprising:
   forming a substrate comprising a radio frequency, RF, electrode, the RF electrode having a first contact surface comprising ruthenium, wherein a first anchor electrode is disposed over the substrate and wherein a second anchor electrode is disposed over the substrate, wherein the RF electrode is disposed in the substrate between the first and the second anchor electrodes, and wherein a pull-up electrode is disposed over a beam structure between the first and the second anchor electrodes;
   forming the beam structure within a cavity, wherein the cavity is disposed over the substrate, wherein:
   the beam structure includes a contact portion having a second contact surface comprising ruthenium, the contact portion is disposed over the first contact surface of the RF electrode and the second contact surface is operable to contact the first contact surface when the beam structure is in a pulled-down state; and the cavity contains sacrificial material;

removing the sacrificial material from the cavity to free the beam structure to move within the cavity, wherein the first contact surface and the second contract surface are exposed in the cavity and the second contact surface of the contact portion is operable to contact the first contact surface of the RF electrode when the beam structure is in the pulled-down state;

introducing fluorine into the cavity such that the first contact surface that comprises the ruthenium is modified by the fluorine and the second contact surface that comprises the ruthenium is modified by the fluorine; and sealing the cavity.

2. The method of claim 1, wherein the fluorine is introduced using a plasma containing fluorine, and wherein the plasma is formed from a gas containing oxygen and a gas containing fluorine.

3. The method of claim 2, wherein the gas containing oxygen is $O_2$.

4. The method of claim 3, wherein the gas containing fluorine is $CF_4$.

5. The method of claim 4, wherein the plasma is present in the cavity for a period of between about 20 seconds and about 60 seconds.

6. The method of claim 5, wherein a ratio of $CF_4$ to $O_2$ is between about 1:4 to about 4:1.

7. The method of claim 6, wherein the ratio is about 1:4 and the plasma is present for a period of about 60 seconds.

8. The method of claim 6, wherein the ratio is about 4:1 and the plasma is present for a period of about 20 seconds.

9. The method of claim 1, wherein the second contact surface that comprises the ruthenium is modified by the fluorine and includes $C_xF_y$ polymers on a surface.

10. The method of claim 1, wherein the fluorine introduced into the cavity forms fluorinated Self-Assembled Monolayers on the first contact surface and the second contact surface.

11. A micro-electromechanical system, MEMS device, comprising:
a substrate comprising a radio frequency, RF, electrode, the RF electrode having a first contact surface comprising ruthenium that is modified by fluorine;
a first anchor electrode disposed over the substrate;
a second anchor electrode disposed over the substrate, wherein the RF electrode is disposed in the substrate between the first and the second anchor electrodes; and wherein:
a beam structure disposed over the first and the second anchor electrodes and in a cavity, the cavity disposed over the substrate and the beam structure is operable to move within the cavity, wherein the beam structure includes a contact portion having a second contact surface comprising ruthenium that is modified by fluorine, the contact portion disposed over the first contact surface of the RF electrode; and
the second contact surface is operable to contact the first contact surface when the beam structure is in a pulled-down state; and
a pull-up electrode disposed over the beam structure between the first and the second anchor electrodes.

12. The MEMS device of claim 11, further comprising:
a dielectric roof disposed over the pull-up electrode, the dielectric roof including at least one release hole that extends through the dielectric roof to the cavity; and
a seal disposed in each release hole.

13. The MEMS device of claim 11, further comprising at least one of:
a first electrical contact disposed in or over the substrate.

14. The MEMS device of claim 11, wherein the beam structure comprises:
a first conductive layer;
a first dielectric layer disposed over a first surface of the first conductive layer;
a second dielectric layer disposed over a second surface of the first conductive layer, the second surface opposing the first surface;
a second conductive layer disposed over the second dielectric layer; and
a third dielectric layer disposed over the second conductive layer.

15. The MEMS device of claim 11, wherein
the cavity is a first cavity; and
a second conductive layer includes a second cavity disposed within a portion of the second conductive layer.

* * * * *

UNITED STATES PATENT AND TRADEMARK OFFICE
CERTIFICATE OF CORRECTION

| | | |
|---|---|---|
| PATENT NO. | : 12,172,888 B2 | Page 1 of 1 |
| APPLICATION NO. | : 17/632762 | |
| DATED | : December 24, 2024 | |
| INVENTOR(S) | : James D. Huffman et al. | |

It is certified that error appears in the above-identified patent and that said Letters Patent is hereby corrected as shown below:

In the Claims

In Column 6, Line 50, replace "a MEMS device" with --a micro-electromechanical system, MEMS, device--.

Signed and Sealed this
Fourth Day of February, 2025

Coke Morgan Stewart
*Acting Director of the United States Patent and Trademark Office*